(12) United States Patent
Yang et al.

(10) Patent No.: US 7,645,698 B2
(45) Date of Patent: Jan. 12, 2010

(54) METHOD FOR FORMING BARRIER LAYER

(75) Inventors: Yu-Ru Yang, I-Lan (TW); Chien-Chung Huang, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 4 days.

(21) Appl. No.: 11/646,387

(22) Filed: Dec. 28, 2006

(65) Prior Publication Data
US 2007/0105367 A1    May 10, 2007

Related U.S. Application Data

(60) Continuation of application No. 10/841,562, filed on May 10, 2004, now Pat. No. 7,199,040, which is a division of application No. 10/461,346, filed on Jun. 16, 2003, now abandoned.

(51) Int. Cl.
*H01L 21/4763* (2006.01)
(52) U.S. Cl. ............... 438/637; 438/622; 257/E21.169
(58) Field of Classification Search ............... 438/622, 438/637
See application file for complete search history.

(56) References Cited

U.S. PATENT DOCUMENTS

| 5,930,669 | A | 7/1999 | Uzoh |
| 6,261,963 | B1 | 7/2001 | Zhao et al. |
| 6,342,448 | B1 * | 1/2002 | Lin et al. ............. 438/687 |
| 6,383,920 | B1 * | 5/2002 | Wang et al. ........... 438/639 |
| 6,472,757 | B2 | 10/2002 | Marathe et al. |
| 6,972,254 | B1 * | 12/2005 | Lopatin et al. ......... 438/637 |

* cited by examiner

*Primary Examiner*—Alexander G Ghyka
(74) *Attorney, Agent, or Firm*—Arent Fox LLP

(57) ABSTRACT

A method for forming barrier layers comprises steps of providing a conductive layer, forming a first dielectric layer on the conductive layer, the first dielectric layer having a via therein, forming a first metal layer covering the first dielectric layer and the conductive layer, forming a layer of metallized materials on the first metal layer, removing the layer of metallized materials above the via bottom in the first dielectric layer, and leaving the layer of metallized materials remaining on a sidewall of the via in the first dielectric layer; and forming a second metal layer covering the layer of metallized materials. The accomplished barrier layers will have lower resistivity in the bottom via of the first dielectric layer and they are capable of preventing copper atoms from diffusing into the dielectric layer.

16 Claims, 7 Drawing Sheets

METHOD FOR FORMING BARRIER LAYER

CROSS-REFERENCE TO RELATED APPLICATIONS

This application is a continuation of U.S. patent application Ser. No. 10/841,562, filed May 10, 2004 now U.S. Pat. No. 7,199,040 which is a divisional of U.S. patent application Ser. No. 10/461,346, filed Jun. 16, 2003, now abandoned.

BACKGROUND OF THE INVENTION

1. Field of the Invention

The present invention relates to a method for the manufacture of semiconductor devices and more particularly to the method for forming a barrier layer in a damascene structure.

2. Description of the Prior Art

In the processes for the manufacture of semiconductor devices, when the active elements of these semiconductor devices are constructed, the following work will be the manufacture of the metal conductive layers above these active elements to complete the electrical interconnection inside the semiconductor devices. The processes for the manufacture of the metal conductive layers are usually as follows: first forming a metal layer above the active regions of the semiconductor devices, second proceeding with photoresist coating, developing, and etching to complete the manufacture of the first metal layer, third depositing a dielectric layer on the first metal layer, and finally proceeding with the manufacture of multiple metal layers dependent on the needs of the different semiconductor devices.

For many years, materials of metal conductive layers of semiconductors are mainly aluminum and aluminum alloys. However, as sizes of semiconductor devices get more and more smaller, operating speeds of semiconductor devices get more and more faster, and power consumptions of semiconductor devices get more and more lower, it is necessary to use metal materials of lower resistivity and dielectric materials of low dielectric constant to complete the electrical interconnection inside semiconductor devices. U.S. Pat. No. 6,489,240 B1 cites using copper and dielectric materials of dielectric constant lower than 4 to complete the electrical interconnection inside semiconductor devices. When copper is used as the material of metal conductors of semiconductors, as shown in FIG. 1A, considering that copper is difficult to be vaporized after etching processes, a dual damascene structure 10 is often used to proceed with copper forming processes inside the dual damascene structure 10. U.S. Pat. No. 6,492,270 B1 mentions the details of forming copper dual damascene. A dual damascene structure 10 comprises a first etch-stop layer 120, a first dielectric layer 160, a second etch-stop layer 140, and a second dielectric layer 180. Before copper processes inside the dual damascene structure 10 above the copper metal layer 100 are performed, as shown in FIG. 1B, a barrier layer 190 has to be formed to prevent copper atoms from diffusing into surrounding dielectric layers.

In order to prevent copper atoms from diffusing into dielectric layers in the prior art, titanium nitride (TiN) or tantalum nitride (TaN) is usually used to form a barrier layer. U.S. Pat. No. 6,541,374 B1 mentions details of forming a barrier layer with TiN. Practically, when the barrier layer 190 is deposited, as a result of the direction of depositing is about perpendicular to the wafer surface, the thickness of the sidewall of the dual damascene structure 10 will be about one-fifth to a half of the thickness above the via bottom in the first dielectric layer 160 and above the trench bottom in the second dielectric layer 180, easily causing that the deposition of the sidewall of the dual damascene structure 10 is incomplete and copper atoms formed later in the dual damascene structure 10 diffuse into surrounding dielectric layers. Consequently the electric property of the surrounding dielectric layers will be affected and then the semiconductor devices will be damaged. Accordingly there is a need for completely depositing a barrier layer of the sidewall of a dual damascene structure 10 to prevent copper atoms from diffusing into surrounding dielectric layers.

In the other hand, the resistivity of nitrided metal materials in the prior art is far more higher than the resistivity of metal materials. Hence if TiN or TaN is used as the material of the barrier layer 190 in the dual damascene structure 10, the resistivity between metals in the dual damascene structure 10 will be so high that the operating speed and the power consumption of the semiconductor devices will be influenced. Therefore there is a need for reducing the resistivity of the barrier layer 190 above the bottom via in the first dielectric layer 160.

SUMMARY OF THE INVENTION

One main purpose of the present invention is to use the barrier layer formed by the first metal layer, the layer of metallized materials, and the second metal layer to fully prevent copper atoms from diffusing into surrounding dielectric layers.

The other main purpose of the present invention is to reduce the resistivity of the barrier layer above the via bottom in the dielectric layer of a dual damascene structure and to make a good ohmic contact between the barrier layer and the copper layer below the barrier layer and the copper layer later formed above the barrier layer.

The present invention uses chemical vapor deposition processes or physical vapor deposition processes to form a barrier layer on a conductive layer of a semiconductor device and then uses ion-bombardment to remove metallized materials of higher resistivity to reduce the resistivity of the barrier layer neighboring to the conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
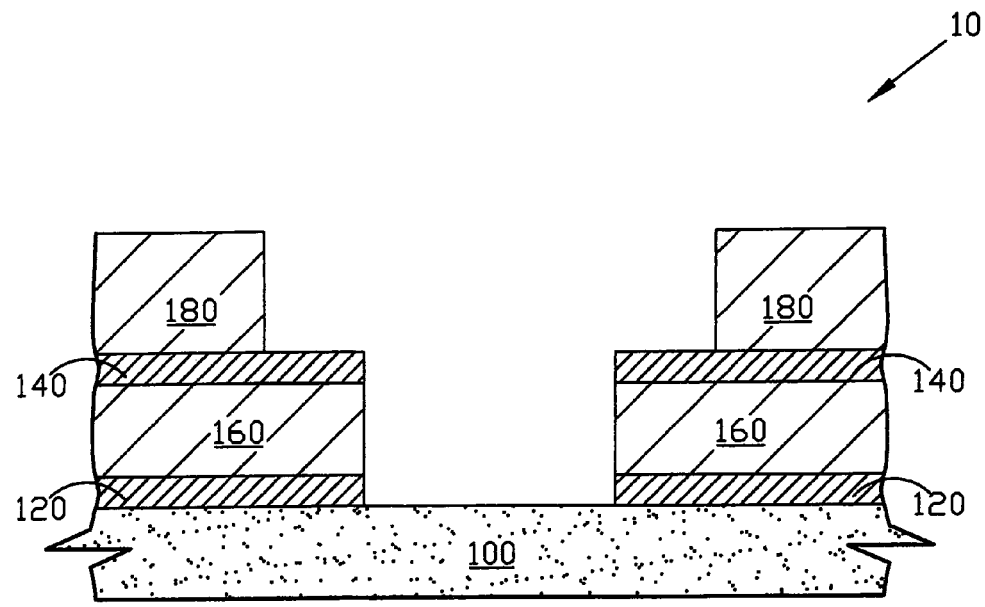
FIG. 1A shows an illustrative chart of a dual damascene structure of the prior art.
Figure 1B:
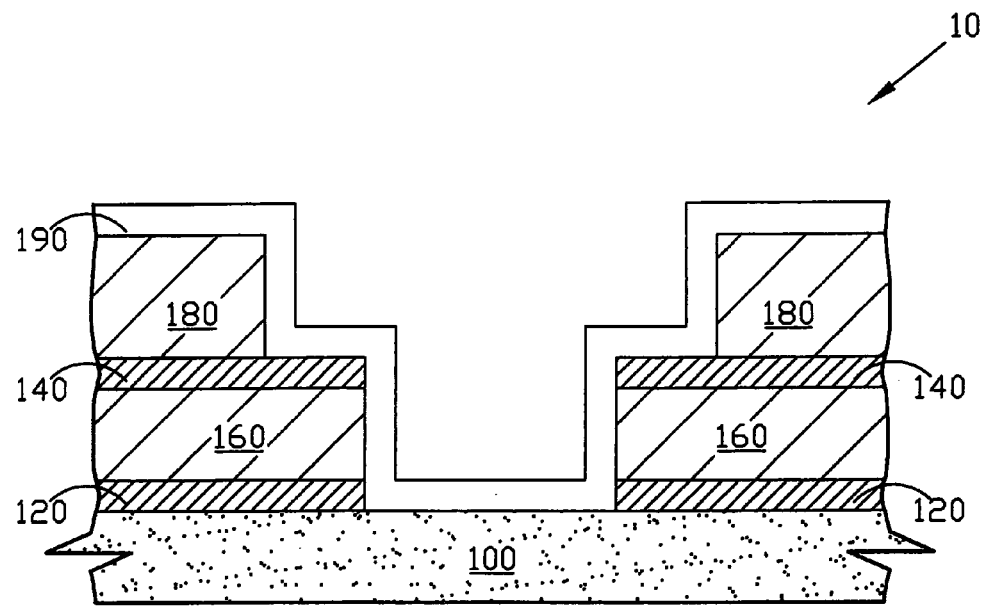
FIG. 1B shows an illustrative chart of forming a barrier layer on a dual damascene structure of the prior art.

Some embodiments of the invention will be described exquisitely as below. Besides, the invention can also be practiced extensively in other embodiments. That is to say, the scope of the invention should not be restricted by the proposed embodiments. The scope of the invention should be based on the claims proposed later.

In the first preferred embodiment of the present invention, as shown in FIGS. 2A-2E, a dual damascene structure 20 has been already formed on a metal layer 200 of a wafer. The dual damascene structure 20 comprises a first etch-stop layer 220, a first dielectric layer 260 on the first etch-stop layer 220, a second etch-stop layer 240 on the first dielectric layer 260, and a second dielectric layer 280 on the second etch-stop layer 240. Wherein the metal layer 200 is a copper layer. The material of the first etch-stop layer 220 and the second etch-stop layer 240 is the material which can prevent copper atoms from diffusing into surrounding dielectric layers, such as silicon nitride ($Si_3N_4$). As for the material of the first dielectric layer 260 and the second dielectric layer 280, the material can be silicon dioxide or any other material of which the dielectric constant is lower than 4, such as fluorinated silicate glass (FSG), organo silicate glass, fluorinated amorphous carbon, hydrogenated amorphous carbon, and tetrafluoropoly-p-xylylene. These materials are formed by chemical vapor deposition processes. The material of the first dielectric layer 260 and the second dielectric layer 280 formed can also be hydrogenated silsesquioxane (HSQ), poly arylene ethers (PAE), co-polymar of divinylsiloxane and bis-Benzocyclobutene, aerogel, and xerogel. And these materials are formed by spin coating.

Figure 2A:
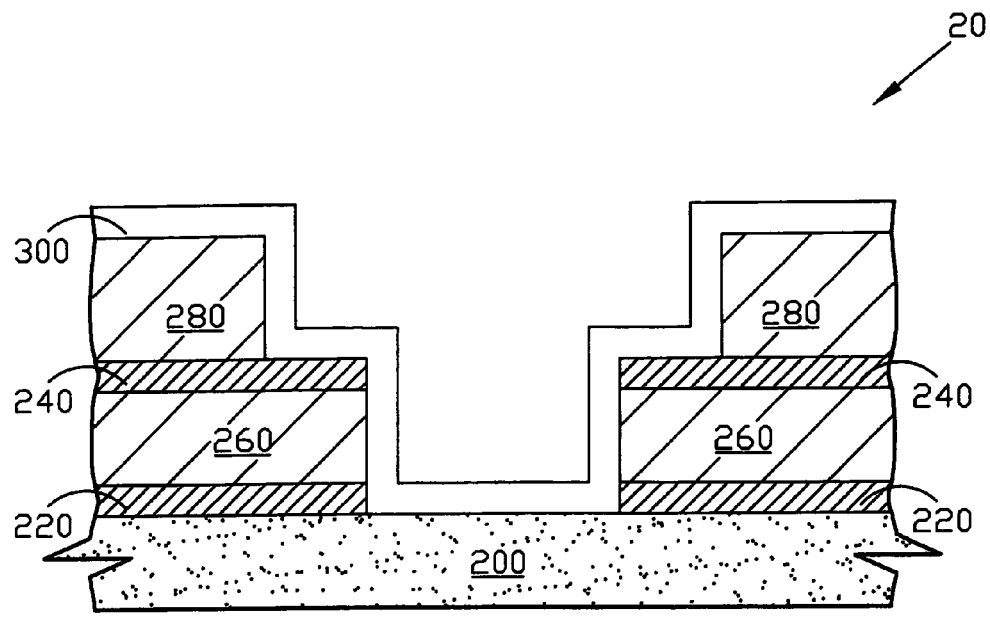
FIGS. 2A-2E shows an illustrative chart of the steps for forming multi-barrier layers on a dual damascene structure of one embodiment in the present invention.
Figure 4:
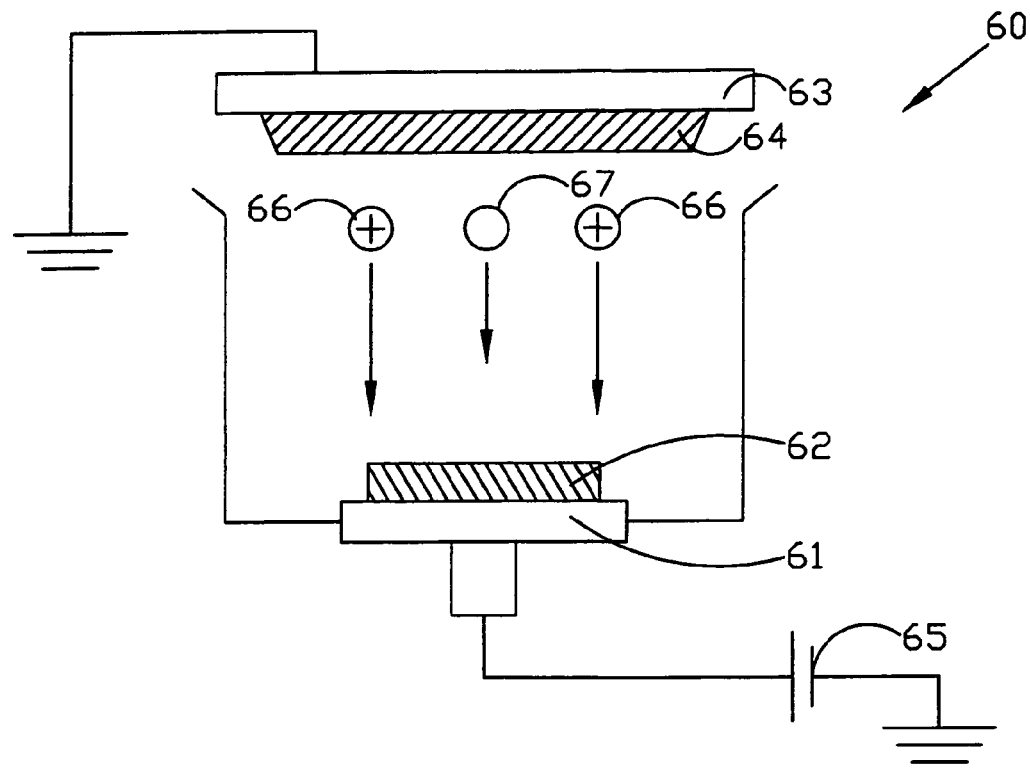
FIG. 4 shows an illustrative chart of proceeding with physical vapor deposition processes in a plasma reactor in the present invention.

As shown in FIG. 2A, a frist tantalum layer 300 is formed on the aforementioned dual damascene structure 20 and the first tantalum layer 300 can be formed by chemical vapor deposition (CVD) processes or physical vapor deposition (PVD) processes. The first tantalum layer 300 is formed by PVD processes in the embodiment. A plasma reactor 60 as shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 to deposit on the wafer 62 forming the first tantalum layer 300. In the PVD processes, the process pressure in the plasma reactor 60 is about from 0 torr to 50 milli-torr and the process temperature in the plasma reactor 60 is about from 0 degrees centigrade to 400 degrees centigrade.

Figure 2B:
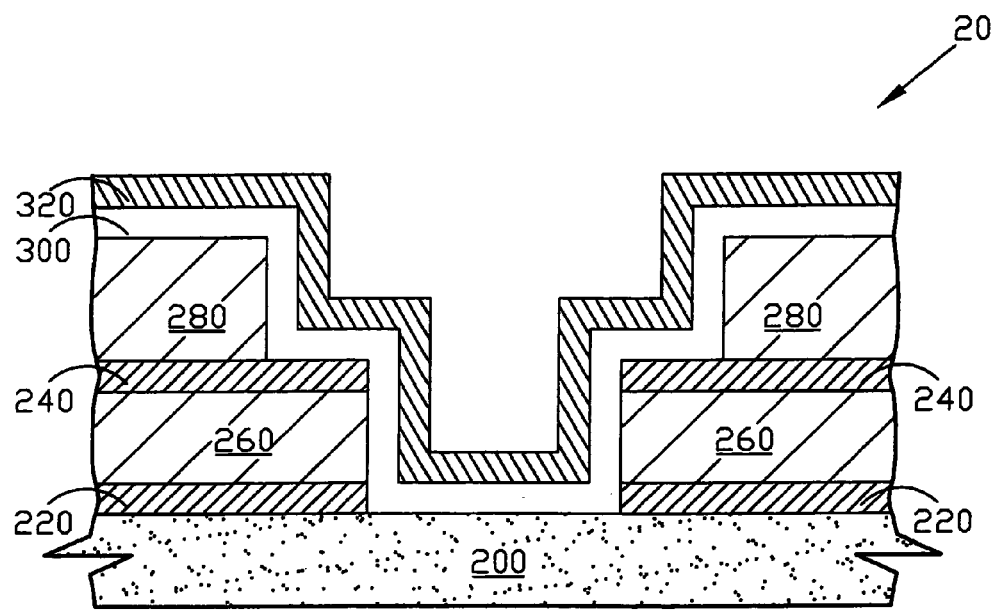

As shown in FIG. 2B, a tantalum nitride layer 320 is formed on the first tantalum layer 300 and the tantalum nitride layer 320 can be formed by CVD processes or PVD processes. The tantalum nitride layer 320 is formed by PVD processes in the embodiment. Such as the way of forming the first tantalum layer 300, filling nitrogen gas into the plasma reactor 60 and the nitrogen molecules will react with the tantalum atoms 67 or tantalum ions 66 from the tantalum target 64 which are bombarded by argon ions on the wafer 62 to form the tantalum nitride layer 320. In the PVD processes, the process pressure in the plasma reactor 60 is about from 0 torr to 50 milli-torr and the process temperature in the plasma reactor 60 is about from 0 degrees centigrade to 400 degrees centigrade.

As a result of the resistivity of the tantalum nitride layer 320 varies with the proportion of the nitrogen atoms within the tantalum nitride layer 320, the resistivity is about between 95 micro-ohms centimeter and 14800 micro-ohms centimeter. The resistivity of the tantalum nitride layer 320 is far more than the resistivity of a tantalum layer. The resistivity of the α-phase tantalum layer is about between 15 micro-ohms centimeter and 30 micro-ohms centimeter and the resistivity of the β-phase tantalum layer is about between 150 micro-ohms centimeter and 220 micro-ohms centimeter. However, the resistivity of a copper layer is about 1.7 micro-ohms centimeter. Accordingly in order to reduce the resistivity above the via bottom in the first dielectric layer 260, the tantalum nitride layer 320 above the via bottom in the first dielectric layer 260 has to be removed.

Figure 2C:
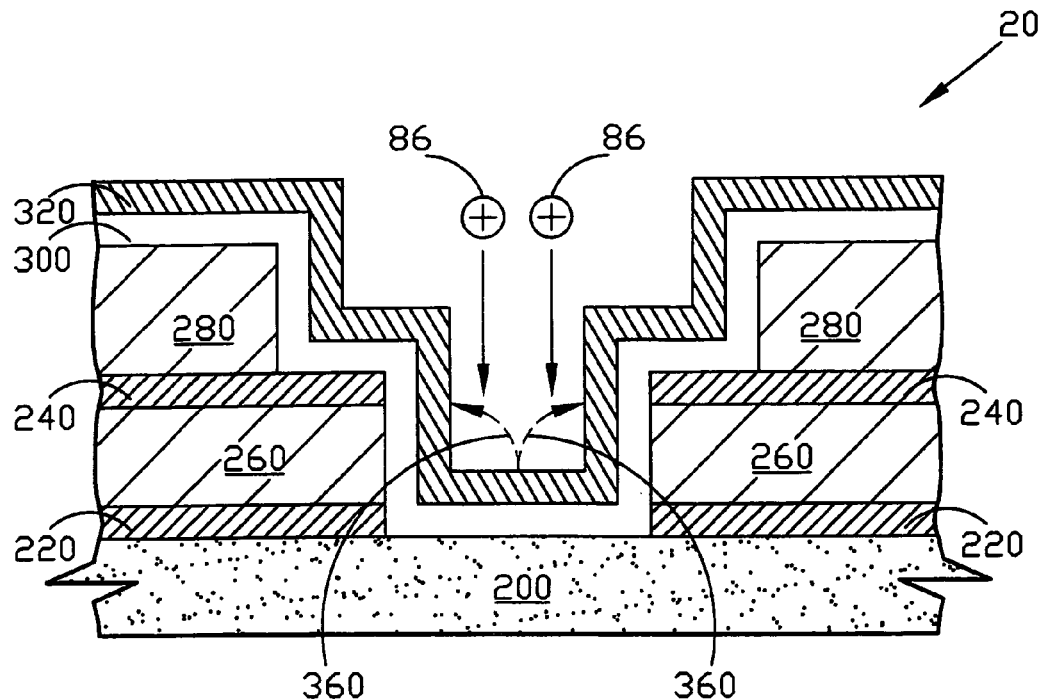
Figure 5:
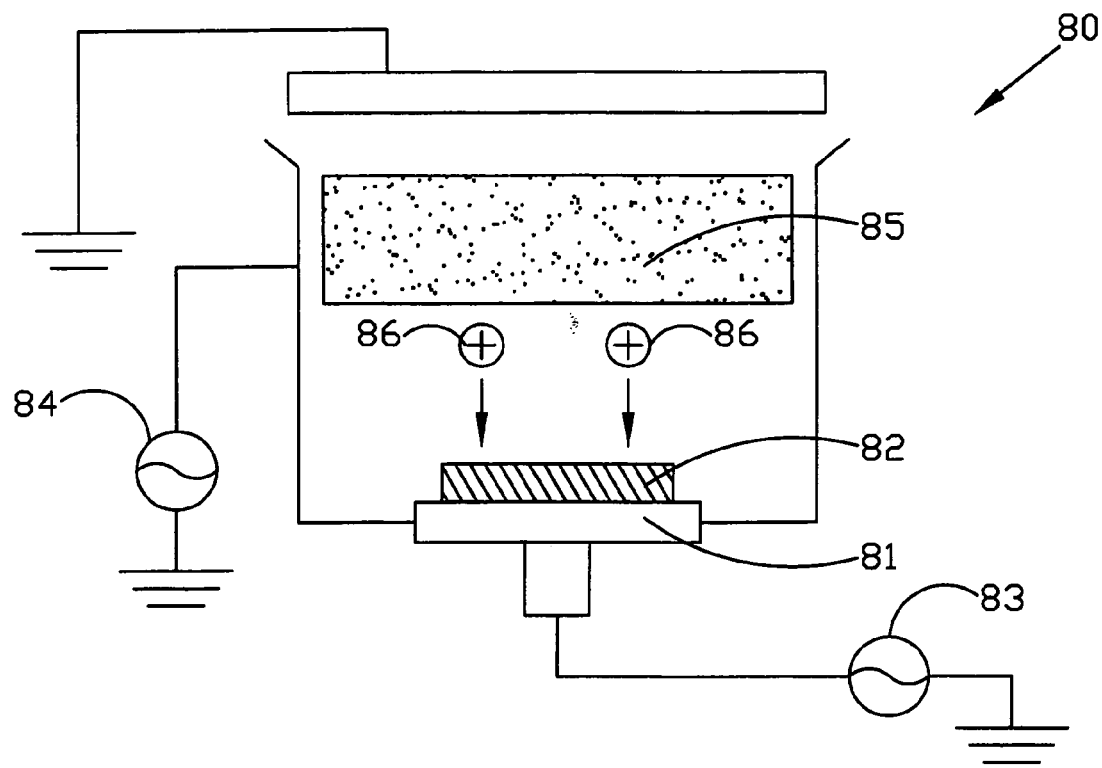
FIG. 5 shows an illustrative chart of proceeding with ion-bombardment processes in a plasma reactor in the present invention.

As shown in FIG. 2C, in order to remove the tantalum nitride layer 320 above the via bottom in the first dielectric layer 260, a method of ion-bombardment is taken. As shown in FIG. 5, a plasma reactor 80 is connected by a plasma generating power 84 and a alternating current bias power 83. A wafer 82 is secured to a wafer supporter 81 in the plasma reactor 80. When an ion-bombardment process is proceeded with, a self direct current bias produced by the alternating current bias power 83 attracts argon ions 86 in the plasma 85 to bombard onto the wafer 82. And then tantalum atoms 360 sputtered out from the tantalum nitride layer 320 above the via bottom in the first dielectric layer 260 will deposit on the sidewall of the via in the first dielectric layer 260. The tantalum nitride layer 320 above the via bottom in the first dielectric layer 260 is removed. Because the marching direction of the argon atoms 86 is perpendicular to the wafer 82 surface, the tantalum nitride layer 320 deposited on the sidewall of the via in the first dielectric layer 260 sustains less ion-bombardment than the tantalum nitride layer 320 deposited above the via bottom in the first dielectric layer 260 does. In the embodiment, the self direct current bias produced on the wafer supporter 81 is higher than the direct current bias in the PVD processes for deposition of the tantalum layer or the tantalum nitride layer.

Figure 2D:
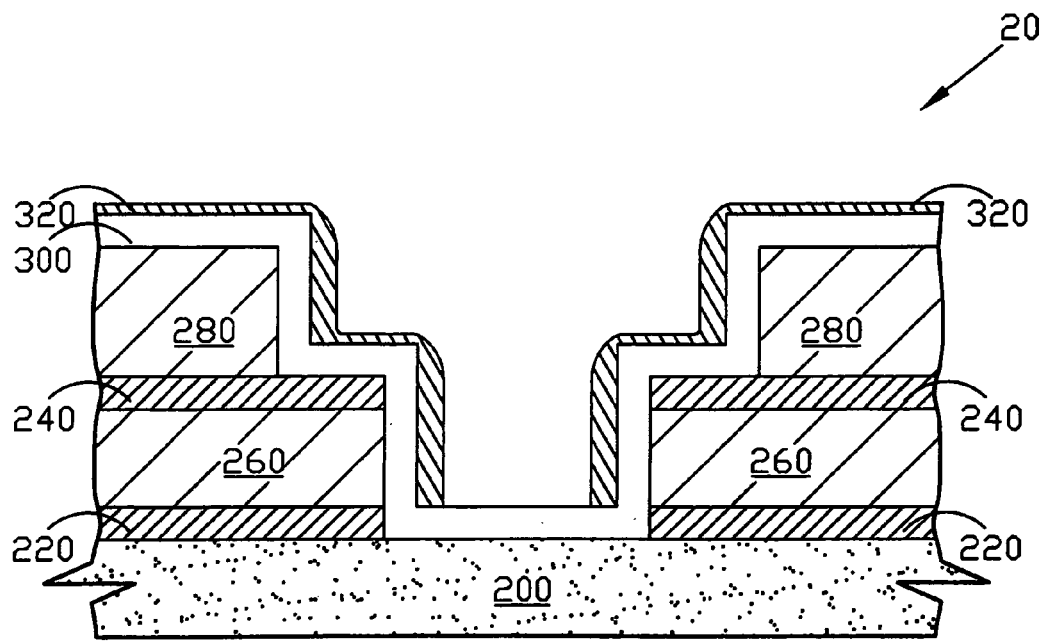
Figure 2E:
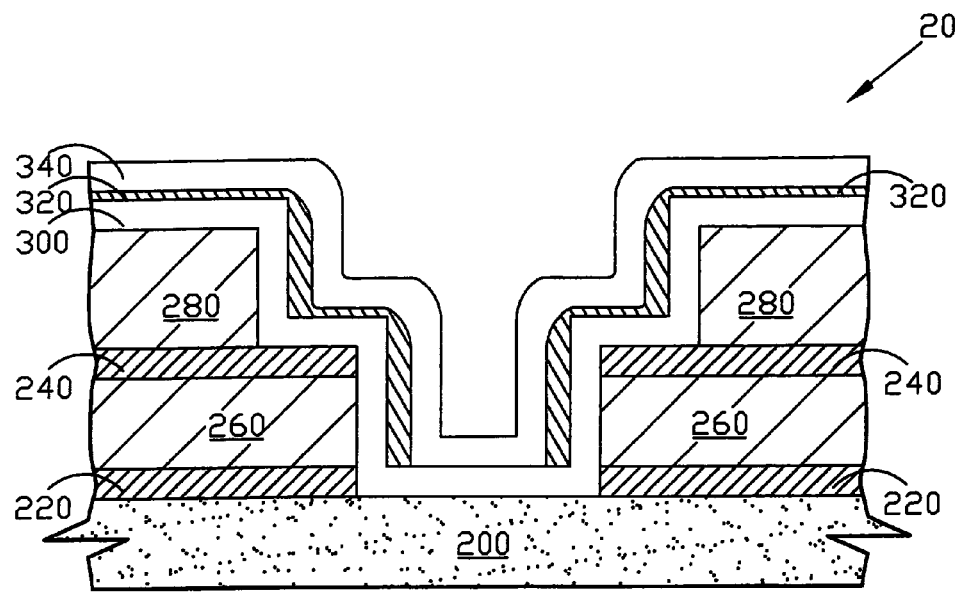

After the tantalum nitride layer 320 above the via bottom in the first dielectric layer 260 is removed by the method of ion-bombardment, the structure above the metal layer 200 will be as shown in FIG. 2D. Only the first tantalum layer 300 exists above the via bottom in the first dielectric layer 260. The tantalum atoms 360 sputtered from the via bottom in the first dielectric layer 260 and from the trench bottom in the second dielectric layer 280 will then separately deposit on the sidewall of the downside of the via in the first dielectric layer 260 and on the sidewall of the downside of the trench in the second dielectric layer 280. And then the figure of the structure will be as shown in FIG. 2D. Further as shown in FIG. 2E, a second tantalum layer 340 is formed on the tantalum nitride layer 320 by the method such as the aforementioned method used for forming the first tantalum layer 300. The second tantalum layer 340 can be formed by PVD processes or CVD processes. The second tantalum layer 340 is formed by PVD processes in the embodiment. A plasma reactor 60 as shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 to deposit on the wafer 62 forming the second tantalum layer 340. In the PVD processes, the process pressure in the plasma reactor 60 is about from 0 torr to 50 milli-torr and the process temperature in the plasma reactor 60 is about from 0 degrees centigrade to 400 degrees centigrade.

After completing the aforementioned steps, the barrier layers of the dual damascene structure 20 will be as shown in FIG. 2E. Except the tantalum layer composed by the first tantalum layer 300 and the second tantalum layer 340 only exists above the via bottom in the first dielectric layer 260 of the dual damascene structure 20, three barrier layers exist all the other portions of the dual damascene structure 20. These three barrier layers are the first tantalum layer 300, the tantalum nitride layer 320, and the second tantalum layer 340 respectively. The tantalum is used because it has good adhesion to copper. The tantalum nitride is capable of preventing copper atoms from diffusing into surrounding dielectric layers. The barrier structure of the three barrier layers is thicker than the barrier layer of the side wall portion of a dual damascene structure in the prior art to prevent copper atoms from diffusing into surrounding dielectric layers. Besides, the tantalum layer has 30% lower resistivity above the via bottom of the first dielectric layer than the resistivity in the prior art. Further the tantalum layer will have good ohmic contact with the copper layer below and the copper layer formed inside the dual damascene structure later.

In the other preferred embodiment of the present invention, as shown in FIGS. 3A-3E, a damascene structure 40 has been already formed on a metal layer 400 of a wafer. The damascene structure 40 comprises an etch-stop layer 420 and a dielectric layer 440 on the etch-stop layer 420. Wherein the metal layer 400 is a copper layer. The material of the etch-stop layer 420 is the material which can prevent copper atoms from diffusing into surrounding dielectric layers, such as silicon nitride ($Si_3N_4$). As for the material of the dielectric layer 440, the material can be silicon dioxide or any other material of which the dielectric constant is lower than 4, such as fluorinated silicate glass (FSG), organo silicate glass, fluorinated amorphous carbon, hydrogenated amorphous carbon, and tetrafluoropoly-p-xylylene. These materials are formed by chemical vapor deposition processes. The material of the dielectric layer 440 can also be hydrogenated silsesquioxane (HSQ), poly arylene ethers (PAE), co-polymar of divinylsiloxane and bis-Benzocyclobutene, aerogel, and xerogel. And these materials are formed by spin coating.

Figure 3A:
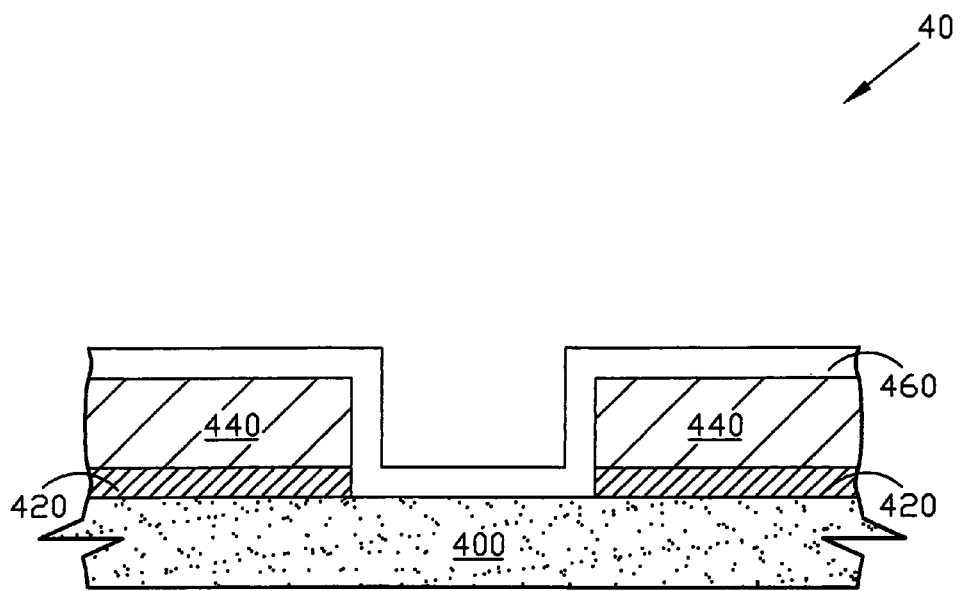
FIGS. 3A-3E shows an illustrative chart of the steps for forming multi-barrier layers on a damascene structure of the other embodiment in the present invention.

As shown in FIG. 3A, a frist tantalum layer 460 is formed on the aforementioned damascene structure 40 and the first tantalum layer 460 can be formed by chemical vapor deposition (CVD) processes or physical vapor deposition (PVD) processes. The first tantalum layer 460 is formed by PVD processes in the embodiment. A plasma reactor 60 as shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 to deposit on the wafer 62 forming the first tantalum layer 460. In the PVD processes, the process pressure in the plasma reactor 60 is about from 0 torr to 50 milli-torr and the process temperature in the plasma reactor 60 is about from 0 degrees centigrade to 400 degrees centigrade.

Figure 3B:
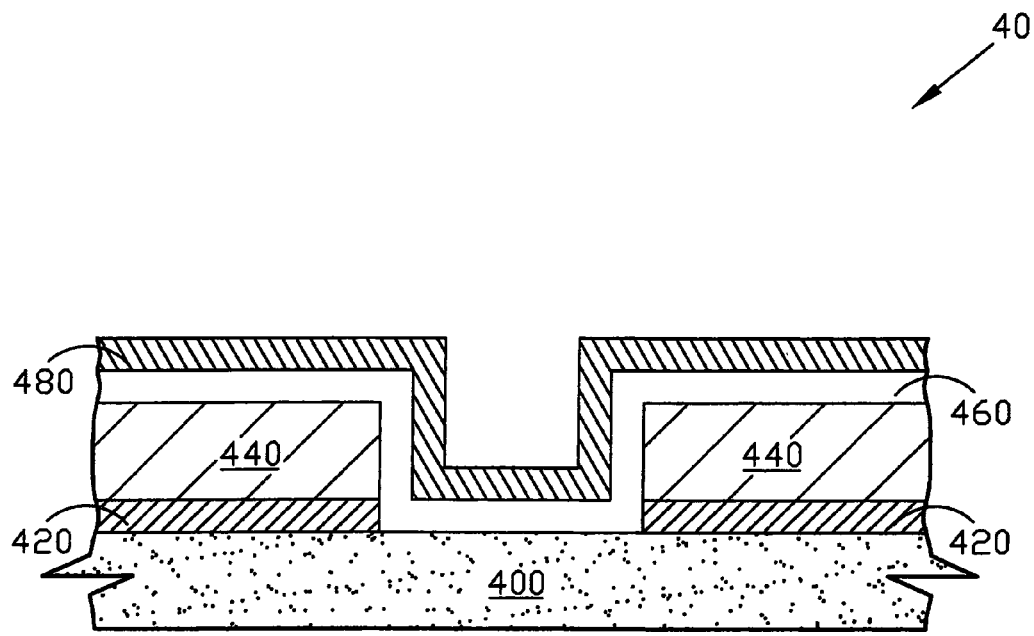

As shown in FIG. 3B, a tantalum nitride layer 480 is formed on the first tantalum layer 460 and the tantalum nitride layer 480 can be formed by CVD processes or PVD processes. The tantalum nitride layer 480 is formed by PVD processes in the embodiment. Such as the way of forming the first tantalum layer 460, filling nitrogen gas into the plasma reactor 60 and the nitrogen molecules will react with the tantalum atoms 67 or tantalum ions 66 from the tantalum target 64 which are bombarded by argon ions on the wafer 62 to form the tantalum nitride layer 480. In the PVD processes, the process pressure in the plasma reactor 60 is about from 0 torr to 50 milli-torr and the process temperature in the plasma reactor 60 is about from 0 degrees centigrade to 400 degrees centigrade.

As a result of the resistivity of the tantalum nitride layer 480 varies with the proportion of the nitrogen atoms within the tantalum nitride layer 480, the resistivity is about between 95 micro-ohms centimeter and 14800 micro-ohms centimeter. The resistivity of the tantalum nitride layer 480 is far more than the resistivity of a tantalum layer. The resistivity of the α-phase tantalum layer is about between 15 micro-ohms centimeter and 30 micro-ohms centimeter and the resistivity of the β-phase tantalum layer is about between 150 micro-ohms centimeter and 220 micro-ohms centimeter. However, the resistivity of a copper layer is about 1.7 micro-ohms centimeter. Accordingly in order to reduce the resistivity above the via bottom in the dielectric layer 440, the tantalum nitride layer 480 above the via bottom in the dielectric layer 440 has to be removed.

Figure 3C:
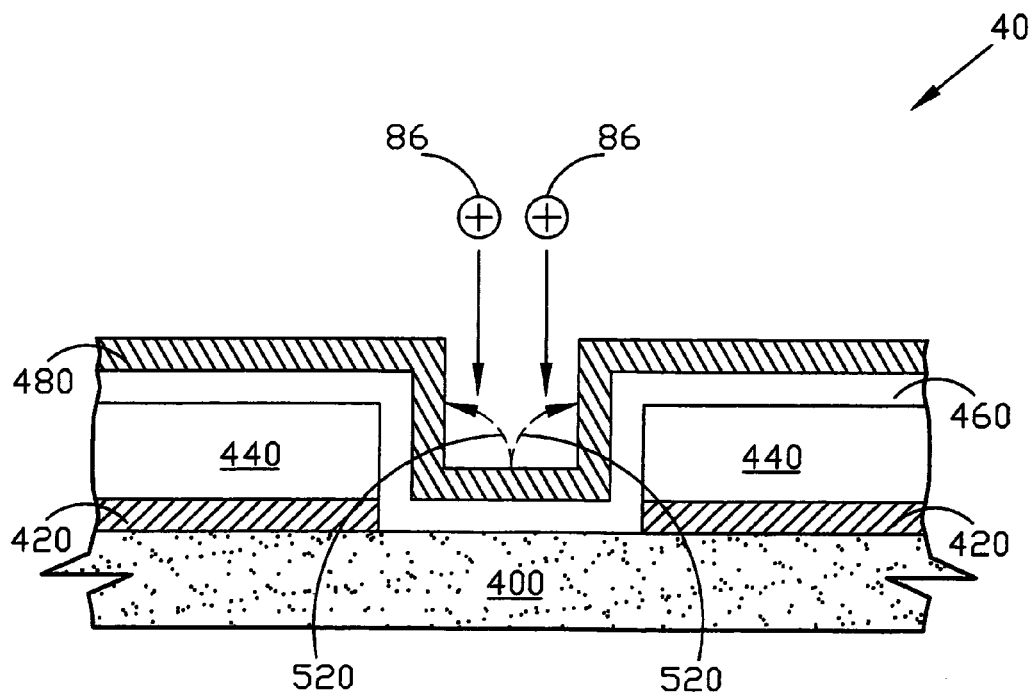

As shown in FIG. 3C, in order to remove the tantalum nitride layer 480 above the via bottom in the dielectric layer 440, a method of ion-bombardment is taken. As shown in FIG. 5, a plasma reactor 80 is connected by a plasma generating power 84 and a alternating current bias power 83. A wafer 82 is secured to a wafer supporter 81 in the plasma reactor 80. When an ion-bombardment process is proceeded with, a self direct current bias produced by the alternating current bias power 83 attracts argon ions 86 in the plasma 85 to bombard onto the wafer 82. And then tantalum atoms 520 sputtered out from the tantalum nitride layer 480 above the via bottom in the dielectric layer 440 will deposit on the sidewall of the via in the dielectric layer 440. The tantalum nitride layer 480 above the via bottom in the dielectric layer 440 is removed. Because the marching direction of the argon atoms 86 is perpendicular to the wafer 82 surface, the tantalum nitride layer 480 deposited on the sidewall of the via in the dielectric layer 440 sustains less ion-bombardment than the tantalum nitride layer 480 deposited above the via bottom in the dielectric layer 440 does. In the embodiment, the self direct current bias produced on the wafer supporter 81 is higher than the direct current bias in the PVD processes for deposition of the tantalum layer or the tantalum nitride layer.

Figure 3D:
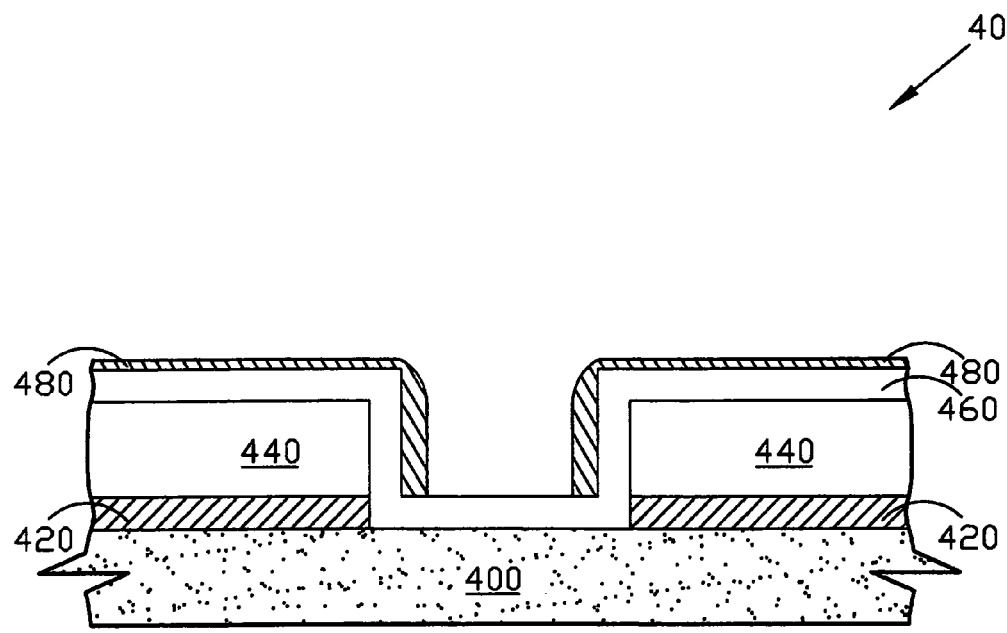
Figure 3E:
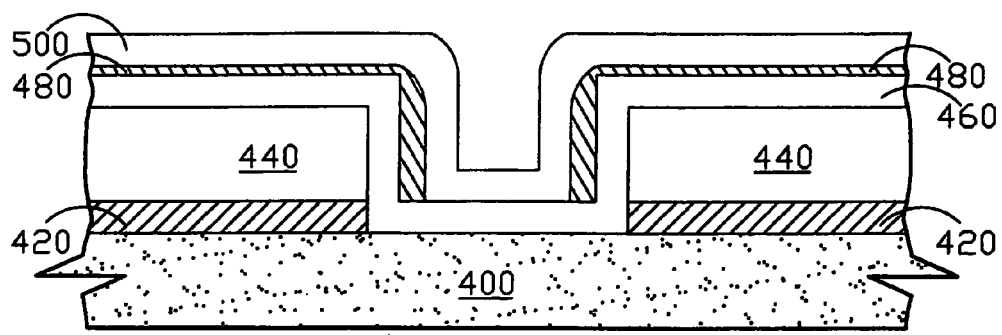

After the tantalum nitride layer 480 above the via bottom in the dielectric layer 440 is removed by the method of ion-bombardment, the structure above the metal layer 400 will be as shown in FIG. 3D. Only the first tantalum layer 460 exists above the via bottom in the dielectric layer 440. The tantalum atoms 520 sputtered from the via bottom in the dielectric layer 440 will then deposit on the sidewall of the downside of the via in the dielectric layer 440. And then the figure of the structure will be as shown in FIG. 3D. Further as shown in FIG. 3E, a second tantalum layer 500 is formed on the tantalum nitride layer 480 by the method such as the aforementioned method used for forming the first tantalum layer 460. The second tantalum layer 500 can be formed by PVD processes or CVD processes. The second tantalum layer 500 is formed by PVD processes in the embodiment. A plasma reactor 60 as shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 to deposit on the wafer 62 forming the second tantalum layer 500. In the PVD processes, the process pressure in the plasma reactor 60 is about from 0 torr to 50 milli-torr and the process temperature in the plasma reactor 60 is about from 0 degrees centigrade to 400 degrees centigrade.

After completing the aforementioned steps, the barrier layers of the damascene structure 40 will be as shown in FIG. 3E. Except the tantalum layer composed by the first tantalum layer 460 and the second tantalum layer 500 only exists above the via bottom in the dielectric layer 440 of the damascene structure 40, three barrier layers exist all the other portions of the damascene structure 40. These three barrier layers are the first tantalum layer 440, the tantalum nitride layer 480, and the second tantalum layer 500 respectively. The tantalum is used because it has good adhesion to copper. The tantalum nitride is capable of preventing copper atoms from diffusing into surrounding dielectric layers. The barrier structure of the three barrier layers is thicker than the barrier layer of the side wall portion of a dual damascene structure in the prior art to prevent copper atoms from diffusing into surrounding dielectric layers. Besides, the tantalum layer has 30% lower resistivity above the via bottom of the dielectric layer than the resistivity in the prior art. Further the tantalum layer will have good ohmic contact with the copper layer below and the copper layer formed inside the damascene structure later.

What is said above is only a preferred embodiment of the invention, which is not to be used to limit the claims of the invention; any change of equal effect or modifications that do not depart from the essence displayed by the invention should be limited in what is claimed in the following.

What is claimed is:

1. A method for forming a barrier layer, comprising:
providing a conductive layer;
forming a first dielectric layer on said conductive layer, said first dielectric layer having a via therein;
forming a first barrier metal layer covering said first dielectric layer and said conductive layer;
forming a barrier layer of metallized materials on said first barrier metal layer;
removing said barrier layer of metallized materials above said first barrier metal layer on said via bottom in said first dielectric layer, and leaving said barrier layer of metallized materials remaining on a whole sidewall of said via in said first dielectric layer without removing said first barrier metal on said via bottom; and
forming a second barrier metal layer covering said barrier layer of metallized materials,
wherein the first barrier metal layer and the second barrier metal layer are formed on the via bottom and the first barrier metal layer, the barrier layer of metallized materials and the second barrier metal layer are placed on the whole sidewall of the via.

2. The method for forming a barrier layer according to claim 1, wherein said layer of metallized materials above said via bottom in said first dielectric layer is removed by an ion-bombardment process.

3. The method for forming a barrier layer according to claim 2, wherein metal atoms bombarded out from said layer of metallized materials are deposited on said sidewall of said via in said first dielectric layer.

4. The method for forming a barrier layer according to claim 2, wherein said ion-bombardment process employs argon ions.

5. The method for forming a barrier layer according to claim 1, further comprising forming a second dielectric layer on said first dielectric layer before forming said first metal layer, wherein a trench is in said second dielectric layer and said trench in said second dielectric layer is connected to said via in said first dielectric layer.

6. The method for forming a barrier layer according to claim 1, wherein said first metal layer is a tantalum layer.

7. The method for forming a barrier layer according to claim 1, wherein said layer of metallized materials is a tantalum nitride layer.

8. The method for forming a barrier layer according to claim 1, wherein said second metal layer is a tantalum layer.

9. The method for forming a barrier layer according to claim 1, wherein said conductive layer is a copper layer.

10. The method for forming a barrier layer according to claim 1, wherein said first metal layer is formed by physical vapor deposition processes.

11. The method for forming a barrier layer according to claim 1, wherein said first metal layer is formed by chemical vapor deposition processes.

12. The method for forming a barrier layer according to claim 1, wherein said layer of metallized materials is formed by physical vapor deposition processes.

13. The method for forming a barrier layer according to claim 1, wherein said layer of metallized materials is formed by chemical vapor deposition processes.

14. The method for forming a barrier layer according to claim 1, wherein said second metal layer is formed by physical vapor deposition processes.

15. The method for forming a barrier layer according to claim 1, wherein said second metal layer is formed by chemical vapor deposition processes.

16. A method for forming a barrier layer, comprising:
providing a conductive layer;
forming a first dielectric layer on said conductive layer, said first dielectric layer having a via therein;
forming a first barrier metal layer covering the surface of said first dielectric layer and said conductive layer;
forming a barrier layer of metallized materials on said first barrier metal layer;
removing said barrier layer of metallized materials above said first barrier metal layer on said via bottom in said first dielectric layer, and leaving said barrier layer of metallized materials remaining on a whole sidewall of said via in said first dielectric layer without removing said first barrier metal on said via bottom; and
forming a second barrier metal layer covering said barrier layer of metallized materials and said first barrier metal layers,
wherein the first barrier metal layer and the second barrier metal layer are formed on the via bottom and the first barrier metal layer, the barrier layer of metallized materials and the second barrier metal layer are placed on the whole sidewall of the via.

* * * * *